(12) United States Patent
Gudovskiy et al.

(10) Patent No.: US 10,516,521 B2
(45) Date of Patent: Dec. 24, 2019

(54) SAMPLING RATE SYNCHRONIZATION BETWEEN TRANSMITTERS AND RECEIVERS

(71) Applicant: OLYMPUS CORPORATION, Tokyo (JP)

(72) Inventors: Denis A. Gudovskiy, San Diego, CA (US); Lichung Chu, San Diego, CA (US); Shinhaeng Lee, San Diego, CA (US)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/739,716

(22) PCT Filed: Jun. 26, 2015

(86) PCT No.: PCT/US2015/038135
§ 371 (c)(1),
(2) Date: Dec. 23, 2017

(87) PCT Pub. No.: WO2016/209290
PCT Pub. Date: Dec. 29, 2016

(65) Prior Publication Data
US 2018/0316482 A1    Nov. 1, 2018

(51) Int. Cl.
*H04L 7/00* (2006.01)
*H04B 1/16* (2006.01)
(Continued)

(52) U.S. Cl.
CPC ....... *H04L 7/0029* (2013.01); *H03H 17/0027* (2013.01); *H03H 17/0642* (2013.01);
(Continued)

(58) Field of Classification Search
CPC ..... H04L 7/0029; H04L 7/005; H04L 1/1887; H03H 14/0027; H03H 14/0642; H04B 1/16
(Continued)

(56) References Cited

U.S. PATENT DOCUMENTS 4,453,259 A * 6/1984 Miller .................. H04L 7/0029
327/161
5,500,874 A   3/1996 Terrell
(Continued)

FOREIGN PATENT DOCUMENTS

JP    2003-060629    2/2003
JP    2003-520358    7/2003
(Continued)

OTHER PUBLICATIONS

Meyr H et al: "Timing Adjustment by Interpolation", Jan. 1, 1998 (Jan. 1, 1998), Digital Communication Receivers : Syncronization, Channel Estimation, and Signal Processing New York, NY, pp. 505-532.
(Continued)

*Primary Examiner* — Lee Nguyen
(74) *Attorney, Agent, or Firm* — Sheppard, Mullin, Richter & Hampton LLP

(57) ABSTRACT

Systems and methods are provided in which a wireless receiver can be configured to digitally synchronize a receive sampling rate to a transmit sampling rate, and may include a digital interpolator controlled by a timing control unit with a timing offset estimator. The timing control unit can be configured to calculate and output parameters to the digital interpolator. The digital interpolator can include a sample buffer followed by a fractional delay filter. Output parameters to the digital interpolator can include a fractional delay timing offset signal of the receiver relative to a transmitter
(Continued)

timing signal and a buffer pointer control signal to control a position of the read pointer relative to a write pointer to compensate for subsample timing offset. The timing offset estimator can be configured to calculate and provide to the timing control unit a sampling period ratio control word and an instantaneous timing offset control word.

23 Claims, 14 Drawing Sheets

(51) Int. Cl.
*H03H 17/00* (2006.01)
*H03H 17/06* (2006.01)
*H04L 1/18* (2006.01)

(52) U.S. Cl.
CPC ............ *H04B 1/16* (2013.01); *H04L 1/1887* (2013.01); *H04L 7/005* (2013.01)

(58) Field of Classification Search
USPC ........................................................ 455/208
See application file for complete search history.

(56) References Cited

U.S. PATENT DOCUMENTS

| | | | |
|---|---|---|---|
| 6,553,087 B1 | 4/2003 | Alelyunas | |
| 6,560,299 B1 | 5/2003 | Strolle | |
| 2004/0058662 A1 | 3/2004 | Gieske | |
| 2009/0180524 A1* | 7/2009 | Wang | H04B 1/7085 375/149 |
| 2014/0105325 A1 | 4/2014 | Huang et al. | |

FOREIGN PATENT DOCUMENTS

| | | |
|---|---|---|
| JP | 2006-502625 | 1/2006 |
| WO | 2001/052546 | 7/2001 |
| WO | 2004/032407 | 4/2004 |
| WO | 2010089180 | 8/2010 |

OTHER PUBLICATIONS

Zhang et al, A Low-Power Low Complexity Mutli-Standard Digitial Recever for Joing Clock Recovery and Carrier Frequency Offset Calibration; IEEE Transactions on Circuits and Systms, Dec. 2014—Dec. 1, 2014, pp. 3478-3486.

Yao Yao et al, "Feed-forward carrier frequency and timing synchroization for MSK modulation" Information, Communications and Signal Processing, 2003 and Fourth PAC IFIC RIM Conference on Multimedia, Proceedings of the 2003 Joing converence of the Fourth International Conference on Singapore Dec. 15, 2003I pp. 549-553.

ISR and Written Opinion for PCTUS2015038135 dated Feb. 25, 2016.

Notice of Reasons for Rejections dated Apr. 2, 2019 for Japanese Application No. 2017-566105.

* cited by examiner

SAMPLING RATE SYNCHRONIZATION BETWEEN TRANSMITTERS AND RECEIVERS

CROSS-REFERENCE TO RELATED PATENT APPLICATIONS

This application is a U.S. National Stage Application under 35 U.S.C. 371 of International Application No. PCT/US15/38135, filed on Jun. 26, 2015, the complete disclosures of which are hereby incorporated by reference.

TECHNICAL FIELD

The disclosed technology relates generally to communication systems, and more particularly, some embodiments relate to systems and methods for sampling rate synchronization between transmitters and receivers, in some cases with subsample timing offset estimation.

DESCRIPTION OF THE RELATED ART

Wireless communication devices have become ubiquitous in today's society. Indeed, with the many continued advancements in communication technology, more and more devices are being introduced in both the consumer, commercial, and government sectors with advanced communications capabilities. Additionally, advances in processing power and low-power consumption technologies, as well as advances in data coding and modulation techniques have led to the proliferation of wired and wireless communications capabilities on a more widespread basis.

For example, communication networks, both wired and wireless, are now commonplace in many home and office environments. Such networks allow various heretofore independent devices to share data and other information to enhance productivity or simply to improve their convenience to the user. Exemplary networks include the Bluetooth® communications network and various IEEE standards-based networks such as 802.11 and 802.16 communications networks, to name a few.

Additionally, tools, instrumentation, and other devices or equipment used in a number of fields and industries have evolved to include wireless communication capabilities as part of their routine function. These communication capabilities can allow for information exchange including information such as, for example, command and control information to control the equipment; telemetry, data, or other information gathered by the equipment; status, reports, and other like "housekeeping" information; as well as other information that may be useful or necessary in the operation, use, deployment and maintenance of the equipment.

FIG. 1 is a simplified block diagram illustrating an example of a transmitter and a receiver that can be used with any of a number of wireless devices including equipment of the type mentioned above. Depending on the desired capabilities, these devices can include a transmitter, a receiver, or both (referred to as a transceiver). The transmitter receives information 122 for transmission, and may include a precoder 132, a modulator 134, an amplifier 136, and an antenna 138. Those of ordinary skill in the art will understand that a wireless transmitter may include other functionality as well. Precoder 132 can be included to, for example, precode the data to optimize performance by taking into account channel parameters or characteristics.

Modulator 134 is essentially used to receive the information to be transmitted and output a radio frequency (RF) modulated signal. Modulation is typically achieved by combining (e.g. multiplying) the information signal 122 (whether or not precoded) with a carrier wave at the desired carrier frequency. Modulation can be carried out in the analog or digital domain depending on the information to be transmitted. Examples of fundamental digital modulation techniques include phase shift keying (PSK), frequency shift keying (FSK), quadrature amplitude modulation (QAM), and variations of the foregoing, although other digital modulation techniques are known and can be used.

Amplifier 136 can be included to amplify the signal for transmission by antenna 138. Antenna 138 is included to radiate the modulated carrier signal as an electromagnetic signal across the communication channel 124 (e.g., the air). Likewise, an antenna 148 is also included on that the receiver. On the receive side, antenna 148 is used to capture the electromagnetic signal radiated across the communication channel. In embodiments using a transceiver, separate antennas can be used for transmit and receive operations or the same antenna can be used depending on the transceiver characteristics.

Continuing with a discussion of the receiver, the example basic receiver illustrated in FIG. 1 includes the antenna 148, an RF amplifier 142, a demodulator 144, and a filter 146. RF amplifier 142 amplifies the signal received by antenna 148 and provided to demodulator 144. Demodulator 144 essentially undoes the modulation that was applied by modulator 134. In other words, demodulator 144 recovers the original information-bearing signal from the modulated carrier wave. Filter 146 can be included to remove unwanted noise in the recovered information signal 123. Filtering can also be used at the front end of the receiver to improve channel selectivity. As with the transmitter, one of ordinary skill in the art will understand how additional features and components can be provided with the receiver depending on the goals and objectives of the communication system. For example, with a digital receiver, the system may include analog-to-digital conversion before demodulation, and demodulation may be performed in the digital domain. As another example, multiple downconversion steps can be performed as in, for example, a superheterodyne receiver. Still further, the incoming signal can first be down converted to an intermediate frequency (IF), the IF signal can be converted to the digital domain before downconversion to baseband.

As noted above, modulator 134 and demodulator 144 can be chosen to implement any of a number of desired modulation techniques, one of which is PSK modulation. PSK is a digital modulation technique that uses changes in phase of the carrier signal to represent the information to be transmitted. PSK modulation uses a finite number of phases to represent a unique pattern of bits or symbols. Accordingly, the incoming information stream 122 is typically operated on in groups and each group is converted into a pattern of bits (e.g., a symbol) which is represented by a particular phase of the modulation technique. At the receiver, the demodulator determines the phase of the receive signal and maps it back to the symbol it represents. In this manner, the original information can be recovered. QPSK, or quadrature phase shift keying, is a variation of PSK that uses 4 phases for modulation. With 4 phases available, QPSK can encode to information bits per symbol. PSK can be implemented using other finite numbers of phases.

FIG. 2 is a block diagram illustrating a basic QPSK Modulator and Demodulator. QPSK modulation is generally well known in the art, and those of ordinary skill in the art will understand how QPSK modulation can be implemented using alternative configurations and architectures. In the example illustrated in FIG. 2, modulator 202 includes a serial to parallel converter 216 low pass filters 232, 234, a local oscillator 242, mixers 236, 238, phase shifter 244, and summer 246. In operation, serial to parallel converter (or demultiplexer) 216 parallelizes the data into 2 separate data streams. Typically, this separates the even and odd bits. Each of the odd bits and even bits can be converted to an NRZ format and a parallel manner. The bits are sent to them in phase arm and a quadrature phase arm for modulation. Low pass filters 232, 234 are used to filter out noise from the data stream. Local oscillator 242, mixers 236, 238, phase shifter 244 are used to modulate the in-phase and quadrature phase components.

In QPSK modulation, two sinusoids (e.g., sin and cos) are used for the modulation (e.g., cos(ωt) and sin(ωt)). The signal on the in-phase arm is multiplied by the local oscillator signal-using mixer 236, and the signal on the quadrature arm is multiplied by a phase-shifted versions of the local oscillator signal at multiplexer 238. Typically, the phase shift is 90°, allowing a multiplication by cos(ωt) and sin(ωt). Accordingly, the modulation separates the original signal into two components, referred to as the I and Q channels or components. The I and Q components are orthogonal, or in quadrature, because they are separated from one another by 90 degrees, although there carrier frequencies are the same. The QPSK modulated signal is obtained by combining the signal from the in-phase and the quadrature phase arms at summer 246. Because the 2 components are orthogonal, they can be summed and transmitted simultaneously on the same channel.

The QPSK demodulator 204 includes a local oscillator 243, mixers 237, 239, phase shifter 245, low pass filters 233, 235 and decision block 249. The received QPSK modulated data stream 252 is split and provided to mixers 237, 239. Mixers 237, 239 demodulate the data to remove the carrier from the I and Q channels. This can be accomplished, for example, by multiplying the incoming signals by cos(ωt) and sin(ωt). The down converted signals are filtered by low pass filters 233, 235 and sent to decision module 249. Decision module 249 evaluate the down converted data stream to arrive at an estimate $\hat{2}2\hat{2}$ of the originally transmitted data 222.

For successful detection of QPSK signals, the receiver must know transmit data samples timing information. Accordingly, receivers often use timing estimation and timing recovery techniques to accommodate this. This can be achieved, for example, by estimating timing offset between transmitter and receiver and by controlling receive oscillator voltage to synchronize receiver sampling rate to the transmitter sampling rate.

Many other modulation and demodulation techniques also utilize some form of timing offset estimation and timing recovery. For example, minimum shift keying (MSK) modulation, which also can be represented as an offset quadrature phase shift keying (O-QPSK) modulation has several attractive properties: low bandwidth relative to data rate and constant envelope for efficient power amplification. However, successful demodulation of MSK-type signals on the receiver side requires precise timing information about transmit data samples. Typically, transmitter and receiver sampling clocks have some frequency mismatch, which leads to a sampling rate mismatch and hence may degrade modem performance.

FIG. 3 is a diagram illustrating an example of transmitter and receiver architectures using PLLs. Transmitter 271 includes a digital circuit 274, a digital-to-analog converter (DAC) 276, a mixer 278, two PLLs 280, 282, and an oscillator 284. Receiver 272 includes a mixer 288, and analog-to-digital converter (ADC) 290, a digital circuit 292, two PLLs 294 296, and an oscillator 298. Oscillators 284 and 298 in this example are implemented as voltage controlled oscillators (VCOs).

PLL 280 generates a clock $f_i$ for digital circuit 274, which is locked to a reference signal with frequency $f_{TX}$ provided directly or indirectly by VCO 284. Digital-to-analog converter (DAC) 276 converts modulated digital samples $y(kT_i)$ into an analog signal y(t) using a clock $f_i$ bypassed by digital circuit 274 and locked to oscillator 284. PLL 282 generates a waveform $f_{c_{TX}}$ to be used by mixer 278 for up conversion. PLL 282, and therefore waveform $f_{c_{TX}}$ is also locked to oscillator 284. Mixer 278 translates analog signal y(t) to a desired carrier frequency $f_c$. In some architectures, such as "direct up conversion" radios, mixer 278 is not required and DAC 276 directly generates the desired transmit signal at a carrier frequency. In some transmit schemes, the relationship between the data symbol period and sampling clock period can be expressed as $$T = R_{TX} \times T_i$$

where $R_{TX}$ is either a rational or irrational fraction, $$T_i = \frac{1}{f_i}$$

is a transmit sampling period and T is a symbol period.

Receiver 272 receives an analog signal radiated by an antenna (not shown) at transmitter 271 across a communication channel or path, 286. Mixer 288 translates the received analog signal from the received RF frequency $f_c$ to the desired center frequency (e.g., at intermediate or baseband). PLL 294, which is locked to oscillator 298, generates a waveform $f_{c_{RX}}$ for this frequency conversion. In the case of a so-called "direct-conversion-receiver," a mixer can be removed and an analog signal can be directly sampled by the ADC 290. PLL 296 generates a clock signal for ADC 290 to sample the received, downconverted signal x(t). Then, digital samples $x(mT_s)$ along with the clock $f_s$, are propagated into digital circuit for demodulation.

Due to frequency offset between reference clocks (oscillators 284, 298), digital samples on the received side experience a sampling mismatch. That sampling mismatch is accumulated over the data packet time frame and, if significant, can interfere with precise data demodulation. Such a sampling mismatch can be compensated on the received side, or in other words, TX/RX sampling rates have to be synchronized.

Conventional analog solutions include methods that accomplish analog-domain sampling mismatch compensation by tuning the VCO's control voltage. In such methods, timing offset expressed in a control voltage can be estimated in either the analog domain or in the digital domain with a subsequent conversion to analog voltage using a dedicated DAC. These methods require additional analog circuits, which are more expensive and less convenient to use as compared to digital-domain solutions. In addition, the precision of such methods is limited and in some cases, analog-domain timing synchronization is not possible such as in case of asynchronous frequency-multiplexed signals.

Digital interpolation methods allow some sampling rate correction in the digital domain by calculating sample values between two consecutive samples in the range [0:1). Hence, digital samples, which are digitized from an analog signal by an ADC with a free running clock, can be resampled to the transmit sampling rate purely in the digital domain with high precision. Such digital interpolation methods include linear interpolation, Lagrange polynomial interpolation and others. Digital interpolation can be performed using conventional finite impulse response (FIR) filters with coefficients that represent certain fractional sample delays in the [0:1] range. One approach to implement a digital interpolator (i.e., a fractional delay filter) is to store filter coefficients for all possible fractional delays in some memory buffer and perform a real time lookup. A drawback of this method is the requirement to maintain a plurality of filter coefficients.

Another approach uses a Farrow filter, which uses fixed filter coefficients and only one fractional delay input parameter. Based on fractional delay input, an arbitrary fractional delay interpolation between any two consecutive samples can be done with fixed coefficient set. Although, fractional delay filters and, in particular, Farrow filters can be used for sampling rate conversion (SRC), their interpolation range is limited by either [0:1] or [−½:½) integer delay ranges. Therefore, such filters can be used as a basis for TX/RX sampling rate synchronization (SRS) rather than a complete solution.

BRIEF SUMMARY OF EMBODIMENTS

According to various embodiments of the disclosed technology solutions are presented to provide timing offset estimation, and sampling rate synchronization for wireless transmitters and receivers. Systems and methods are provided in which a wireless receiver can be configured to digitally synchronize a receive sampling rate to a transmit sampling rate, and may include a digital interpolator controlled by a timing control unit with a timing offset estimator. The timing control unit can be configured to calculate and output parameters to the digital interpolator. The digital interpolator can include a sample buffer followed by a fractional delay filter. Output parameters to the digital interpolator can include a fractional delay timing offset signal of the receiver relative to a transmitter timing signal and a buffer pointer control signal to control a position of the read pointer relative to a write pointer to at least partially compensate, for the timing offset. The timing offset estimator can be configured to calculate and provide to the timing control unit a sampling period ratio control word and an instantaneous timing offset control word.

In further embodiments, a method in a radio frequency receiver for at least partially correcting for a timing offset in a timing signal of the receiver relative to a transmitter timing signal includes the operations of receiving packet data into a buffer; at the beginning of the packet, setting a buffer read pointer to the middle of the buffer; for each sample, accumulating data to interpolate the timing offset based on an estimated sampling period ratio between the timing signal of the receiver and the transmitter timing signal; and adjusting the read pointer earlier or later in the buffer, relative to a write pointer based on the accumulated error value.

In another embodiment, a radio frequency receiver is configured to receive a modulated signal transmitted across a channel, the radio frequency receiver can include: a timing offset estimator configured to estimate a timing offset in a timing signal of the receiver relative to a transmitter timing signal and to generate a timing offset signal representing this timing offset; and a timing control unit configured to receive the timing offset signal from the timing offset estimator and to convert this timing offset signal into a filter control signal and a buffer pointer control signal.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The technology disclosed herein in several embodiments is directed toward solutions to provide sampling rate synchronization between transmitters and receivers. In still further embodiments, systems and methods for performing timing offset estimation, and sampling rate synchronization.

Before describing the technology in further detail, it is useful to describe an example piece of equipment with which the technology can be implemented. One such example is that of a piece of equipment both wired and wireless communication interfaces such as that shown in FIG. 4. After reading this description, one of ordinary skill in the art will appreciate that the technology disclosed herein can be used with any of a number of different devices or equipment having wireless communication capabilities.

Figure 4:
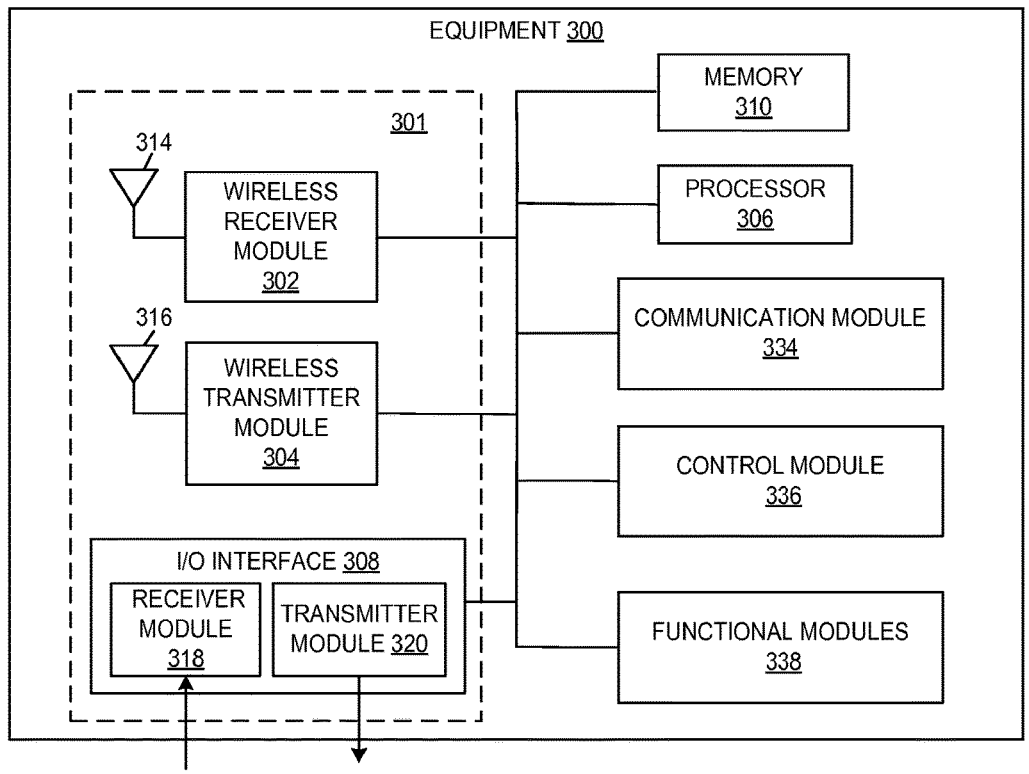
FIG. 4 is a block diagram illustrating one example of equipment with which embodiments of the technology disclosed herein can be implemented.

With reference now to FIG. 4, in this example application, the example equipment 300 includes a communication module 301, a processor 306 (which can include multiple processors or processing units), and memory 310 (which can include memory units or modules of different types). These components are communicatively coupled via a bus 312 over which these modules may exchange and share information and other data. Communication module 301 includes wireless receiver module 302, a wireless transmitter module 304, and an I/O interface module 308.

An antenna 316 is coupled to wireless transmitter module 304 and is used by equipment 300 to transmit radio signals wirelessly to wireless equipment with which it is connected. These outbound RF signals can include information of almost any sort that is sent by equipment 300 to other entities. For example, in the case of a multifunction peripheral (MFP) this can include files representing scanned images or documents, log information, housekeeping information, or other information sent by the MFP relating to its operation. As another example, in the case of a camera, this outbound information can include image files and related data (including metadata) sent by the camera to a computer, printer, or other device.

Antenna 314 is included and coupled to wireless receiver module 302 to allow equipment 300 to receive signals from various wireless terminals within its reception range. Received signals can include information from other equipment used for operation of equipment 300. Continuing with the above two examples, in the case of an MFP, inbound information received by wireless receiver module 302 can include, for example, files to be printed or faxed by the MFP. In the case of a camera, information received could be firmware updates, control information, or other information used by the camera.

Although two antennas are illustrated in this example, one of ordinary skill in the art will understand that various antenna and antenna configurations can be provided as can different quantities of antennas. For example, transmit and receive functions can be accommodated using a common antenna or antenna structure, or separate antennas or antenna structures can be provided for transmit and receive functions as illustrated. In addition, antenna arrays or other groups of multiple antennas or antenna elements, including combinations of passive and active elements, can be used for the transmit and receive functions. The wireless communications implemented using communication module 301 can be implemented according to a number of different wireless protocols, including standardized protocols. Examples of such standardized protocols include Bluetooth®, HiperLan, and various IEEE 802.11 communications standards, although other communication interfaces (whether or not standardized) can be implemented.

An I/O interface module 308 is provided in the illustrated example, and can be configured to couple equipment 300 to other network nodes. These can include nodes or equipment. In this example architecture, the I/O interface module 308 includes a receiver module 318 and a transmitter module 320. Communications via the I/O interface module can be wired or wireless communications, and the transmitter and receiver contained therein can include line drivers and receivers, radios, antennas or other items, as may be appropriate for the given communication interfaces. Transmitter module 320 may be configured to transmit signals that can include voice, data and other communications. These may be sent in a standard network protocol if desired. Receiver module 318 is configured to receive signals from other equipment. These signals can include voice, data and other communications from the other equipment, and can also be received in a standard network protocol if desired. In terms of the above examples of an MFP or digital camera, I/O interface 308 can provide a hardwired complementary interface to the wireless interface described above. This may be, for example, an Ethernet interface, a USB interface, a FireWire interface, or other hardwired interface.

Memory 310, can be made up of one or more modules of one or more different types of memory, and in the illustrated example is configured to store data and other information 324 as well as operational instructions that may be used by the processor to operate equipment 300. The processor 306, which can be implemented as one or more cores, CPUs, DSPs, or other processor units, for example, is configured to execute instructions or routines and to use the data and information in memory 310 in conjunction with the instructions to control the operation of the equipment 300. For example, image-processing routines, such as compression routines, can be stored in memory 310 and used by processor 306 to compress image files from raw files into JPEG files.

Other modules can also be provided with the equipment 300 depending on the equipment's intended function or purpose. A complete list of various additional components and modules would be too lengthy to include, however a few examples are illustrative. For example, a separate communication module 334 can also be provided for the equipment to manage and control communications received from other entities, and to direct received communications as appropriate. Communication module 334 can be configured to manage communication of various information sent to and received from other entities. Communication module 334 can be configured to manage both wired and wireless communications.

A separate control module 336 can be included to control the operation of equipment 300. For example, control module 336 can be configured to implement the features and functionality of equipment 300. Functional modules 338 can also be included to provide equipment functionality. For example, in the case of an MFP, various modules (which may include various forms of hardware and software) can be provided to perform printing, scanning, faxing, and copying operations of the device. In the case of a digital camera, functional modules 338 can include modules such as, for example, optical systems, image capture modules, image processing modules, and so on. In the case of a remote sensor, functional modules can include modules used to perform the sensing and related operations. Again, as these examples illustrate, one of ordinary skill in the art will appreciate how other modules and components can be included with equipment 300 depending on the purpose or objectives of the equipment.

Having thus described an example application, the technology disclosed herein may from time-to-time described herein in terms of this example application. Description in terms of this environment is provided to allow the various features and embodiments of the invention to be portrayed in the context of an exemplary application. After reading this description, it will become apparent to one of ordinary skill in the art how the invention can be implemented in different and alternative environments and applications.

Figure 5:
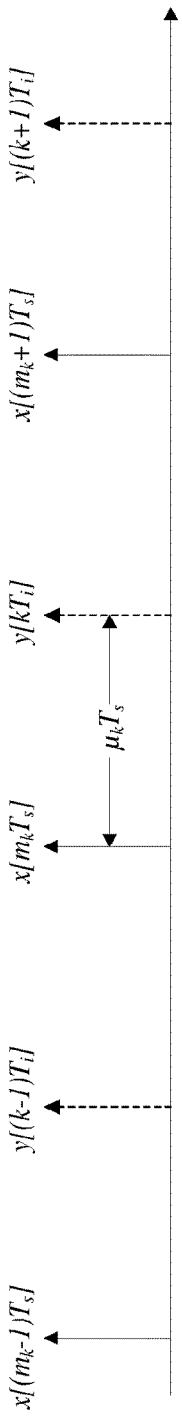
FIG. 5 is a diagram illustrating an example of sampling timing for transmit and receive clocks.
Figure 6:
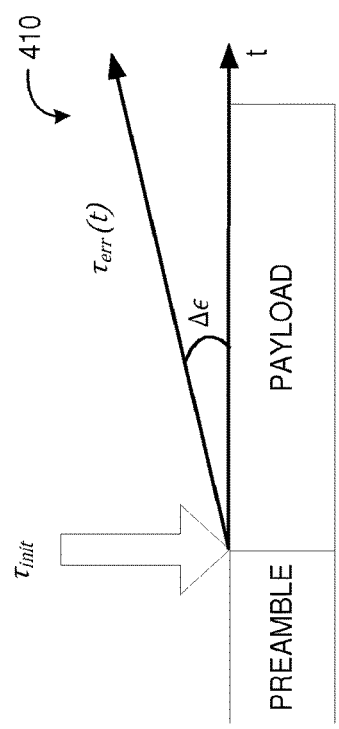
FIG. 6 is a diagram illustrating an example of a timing error function increasing over time as a packet passes through a receiver.

FIG. 5 is a diagram illustrating an example of sampling timing for the transmit and receive clocks. The receive sampling period is defined by the time between solid arrows illustrated in FIG. 5, while the transmit sampling period is defined by the time between the dashed arrows. Where the periods are constant and the receive and transmit periods are equal, the spacing between receive and transmit clock pulses remains constant over time. This corresponds to the case where the sampling rate of the received signal is equal to the sampling rate of the transmit signal. However, where the transmit sampling period differs from the receive sampling period (i.e., sampling rates are different), the transmit and receive sampling points can drift over time. That is, for example, $\mu_k$, the fractional delay between a transmit and receive sample, decreases or increases over time. As time progresses, the error increases as illustrated by the example timing error function 410 shown in FIG. 6. This can be especially problematic for long data payloads.

Figure 1:
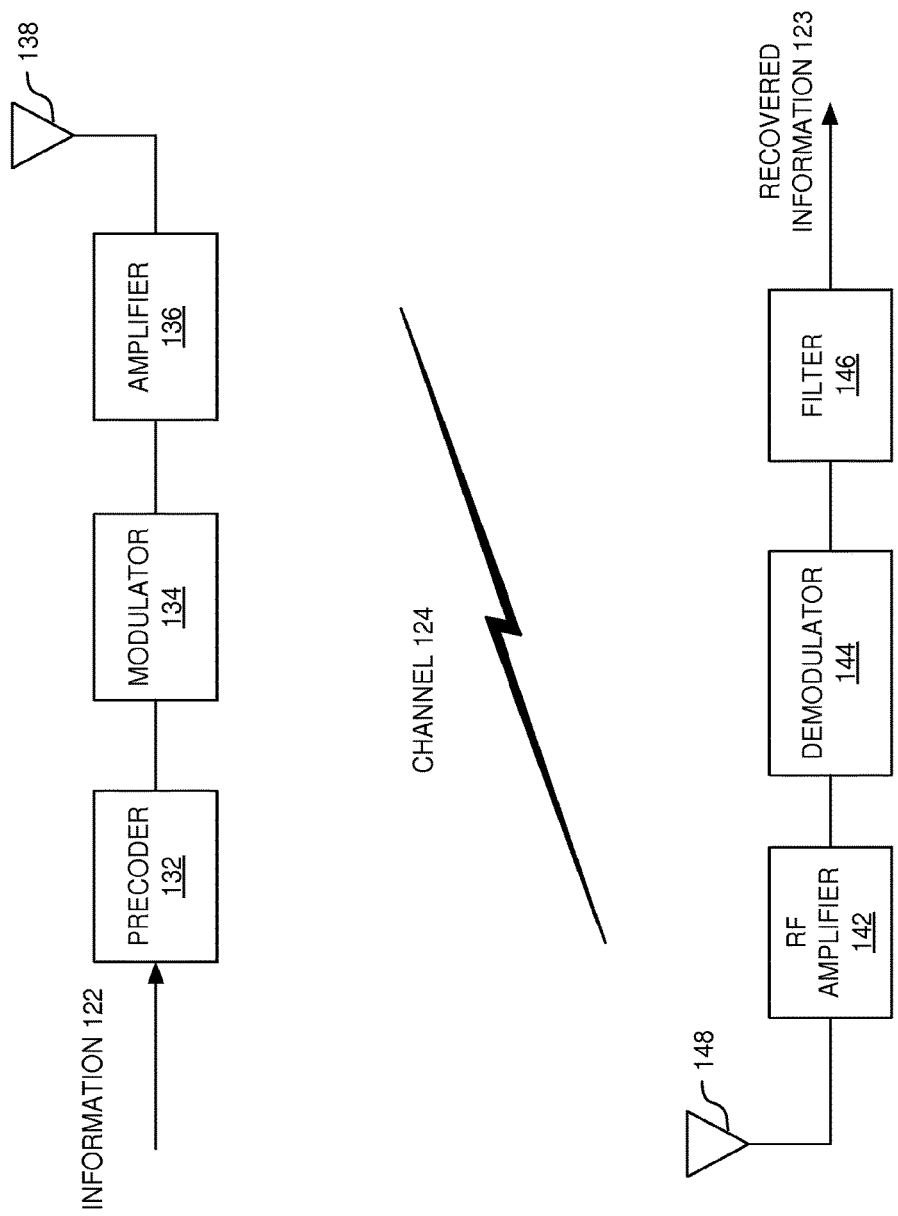
FIG. 1 is a simplified block diagram illustrating an example of a transmitter and a receiver that can be used with wireless devices.
Figure 2:
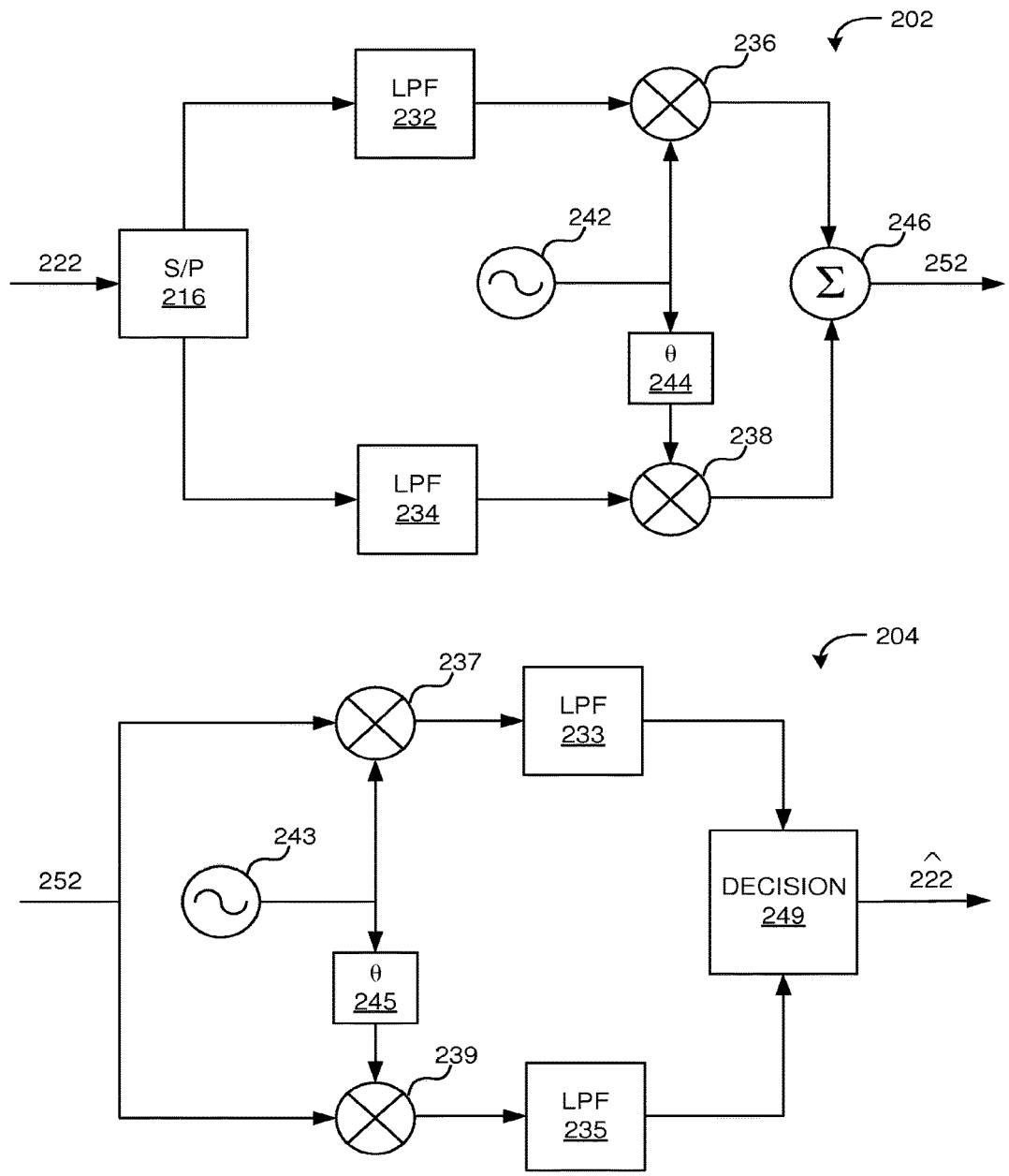
FIG. 2 is a block diagram illustrating an example of a basic modulator and demodulator.
Figure 3:
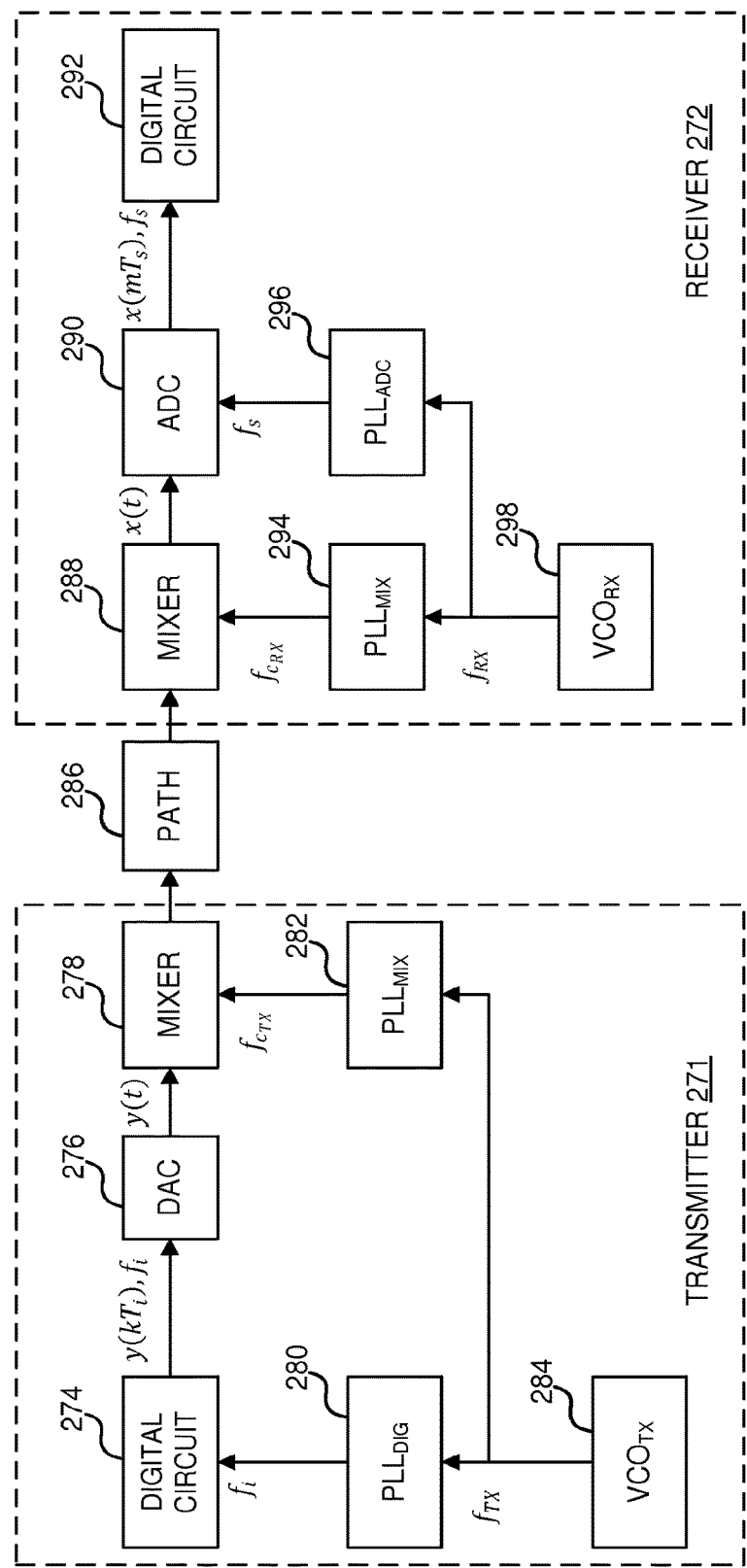
FIG. 3 is a diagram illustrating an example transmitter and receiver implemented using PLLs.
Figure 7:
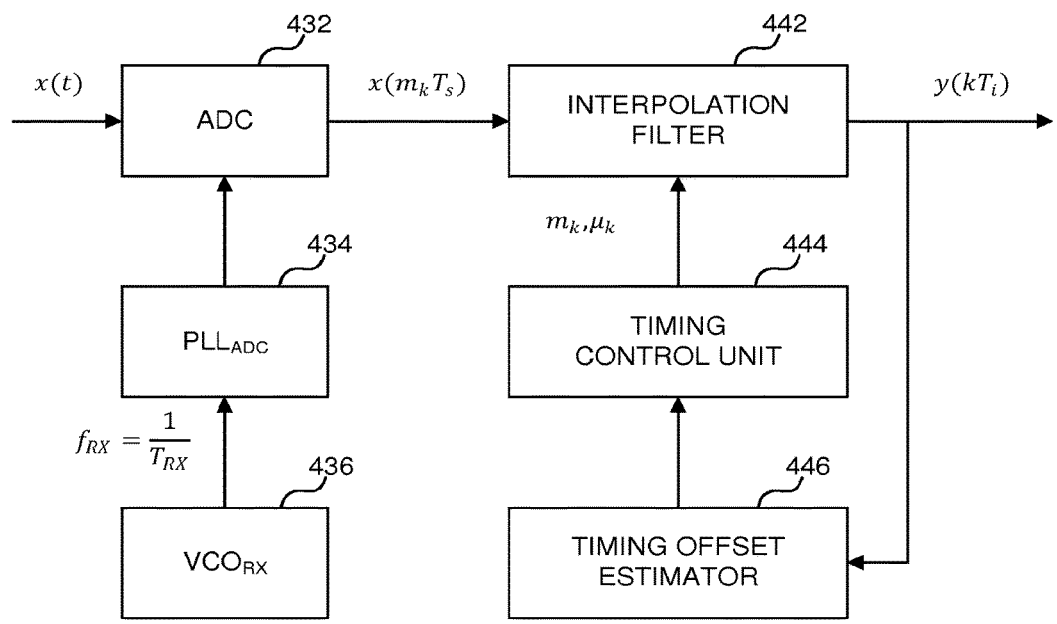
FIG. 7 is a block diagram illustrating an example of receiver architecture for timing offset estimation and correction in accordance with one embodiment of the technology described herein.
Figure 8:
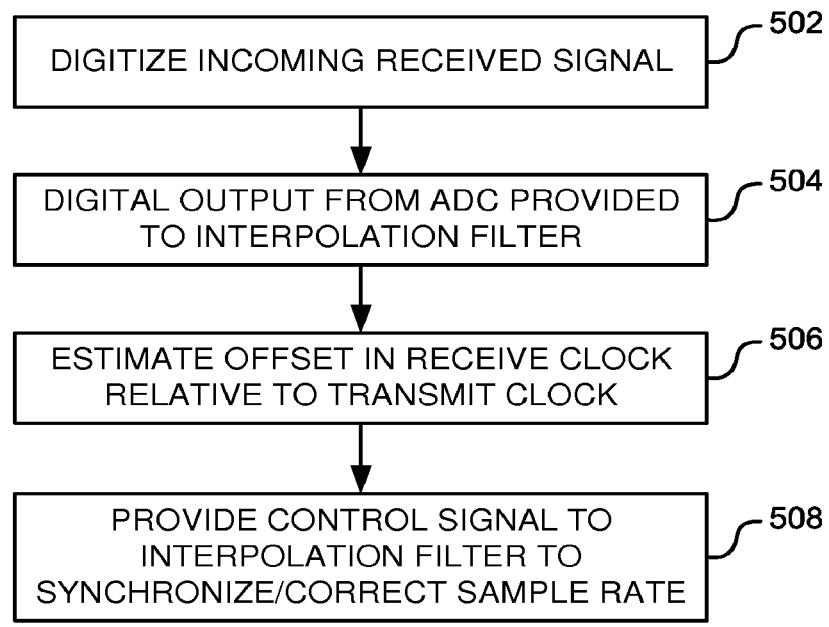
FIG. 8 is an operational flow diagram illustrating an example operation of the receiver architecture of FIG. 7 in accordance with one embodiment of the technology described herein.

FIG. 7 is a block diagram illustrating an example receiver architecture for timing offset estimation and correction in accordance with one embodiment of the technology described herein. FIG. 8 is an operational flow diagram illustrating operation of the example receiver architecture. As with the examples shown in FIG. 3, this example receiver includes an ADC 432. At operation 502, ADC 432 digitizes the incoming downconverted received signal x(t). PLL 434 is included to provide a sample clock for sampling by ADC 432. The sampling clock has a frequency $$f_s = \frac{1}{T_s}$$

where $T_s$ is a receive sampling period. An oscillator (e.g. VCO) 436 provides a reference frequency to PLL 434.

At operation 504, digital output from ADC 432 $x(mT_s)$ is provided to interpolation filter 442, where m is a signal index. Then, we can define a basepoint index $m_k$ as $$m_k = \left\lfloor \frac{kT_i}{T_s} \right\rfloor$$

where $\lfloor\ \rfloor$ notation represents a floor operation. In addition, filter index i can be expressed as $$i = m_k - m$$

and a fractional delay $\mu_k \in [0,1)$ as $$\mu_k = \frac{kT_i}{T_s} - m_k.$$

At operation 506, a timing offset estimator 446 estimates the offset in the receive clock relative to the transmit clock and provide this information to time control unit 444, which, at operation 508, provides a control signal to interpolation filter 442 to perform the sampling rate synchronization or correction.

In some embodiments, interpolation filter 442 can be implemented as a "modified" version of a Farrow filter. The Farrow structure can be used realize an adjustable, fractional-delay, FIR (finite-length impulse response) filter. In some embodiments, the absolute sampling period values are eliminated and the interpolation filter output for a modified Farrow filter structure illustrated can be provided as:

$$y(k-D) = \sum_{n=0}^{N-1} x(m_k - n) \sum_{l=0}^{L} g_l(n)(1 - 2\mu_k)^l = \sum_{n=0}^{N-1} x(m_k - n)h(n, \mu_k)$$

where L is the degree of polynomial, N is the filter length, $g_l(n)$ is the impulse response of linear-phase finite impulse response (FIR) filter, $h(n,\mu_k)$ is the polynomial-based impulse response, and D is the filter group delay.

Figure 9:
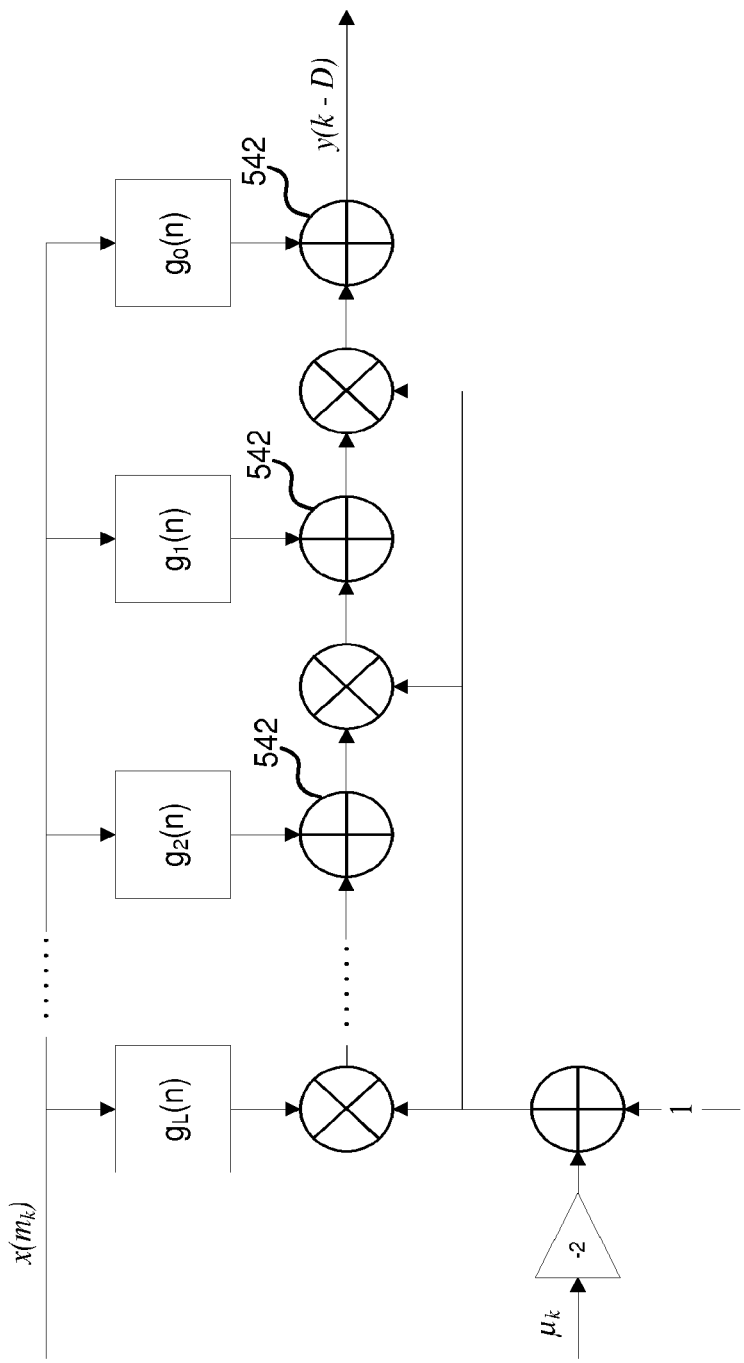
FIG. 9 is a diagram illustrating an example of a modified Farrow filter in accordance with one embodiment of the technology described herein.

FIG. 9 is a diagram illustrating an example of a modified Farrow filter in accordance with one embodiment of the technology described herein. In this example, the input $x(m_k)$ is provided to the filter along with a fractional delay, $\mu_k$. The Farrow filter estimates values of the input signal between the existing discrete-time samples using fixed filter coefficients that provide a desired $g_l(n)$. The delay is applied to each sample, and the samples summed at summing nodes 542 to generate the filter output y(k–D). While the Farrow structure is a convenient method to perform SRC in the fractional delay $\mu_k$ range [0,1), the actual SRS between TX and RX requires an adjustment of the sampling rate in the wider integer range $m_k$ as well.

Figure 10:
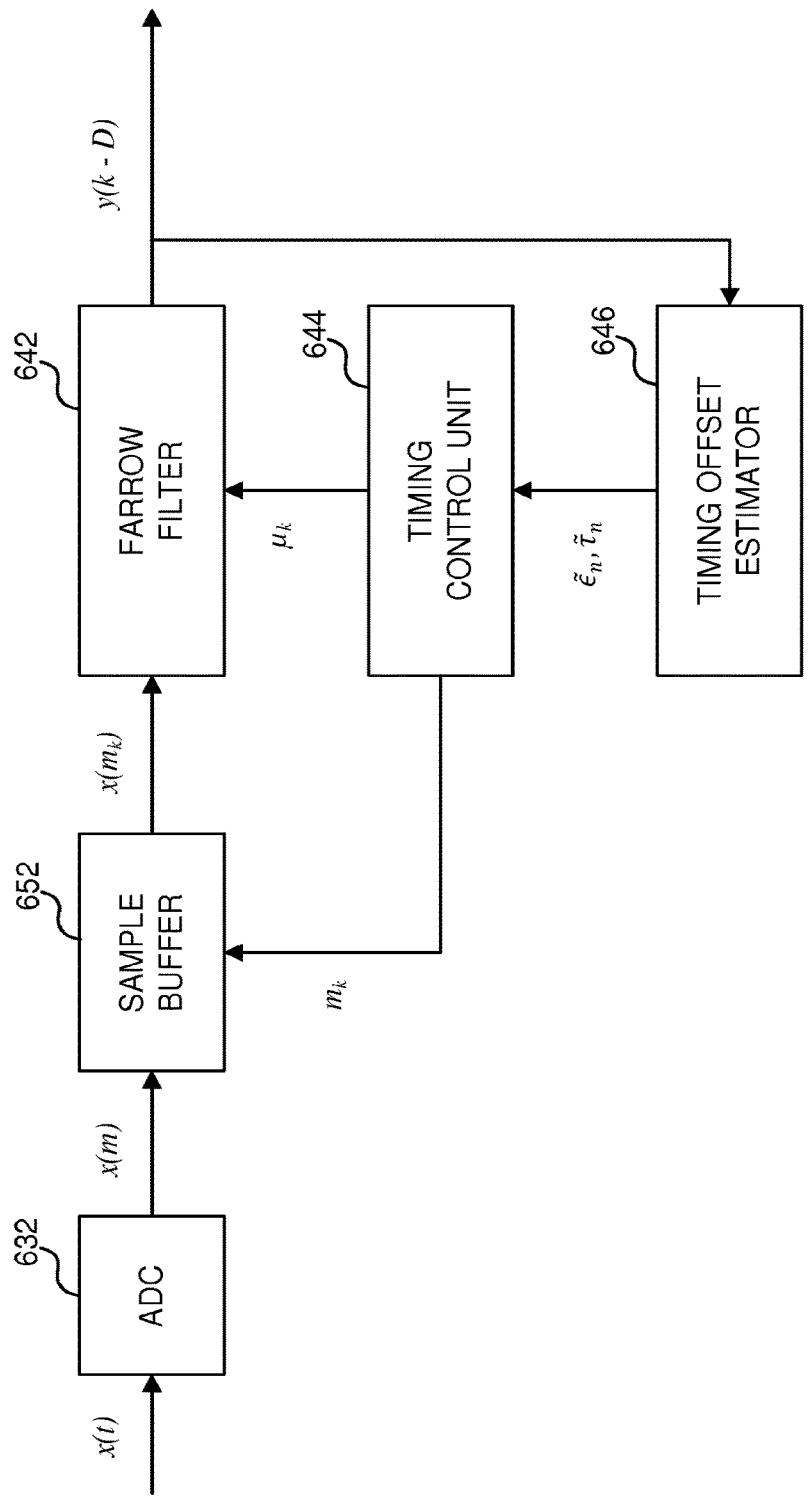
FIG. 10 is a diagram illustrating an example application using a sample buffer in accordance with one embodiment of the technology described herein.

To accommodate this, in various embodiments the interpolation filter, which is in this example embodiment is a Farrow filter, is extended by a sample buffer. FIG. 10 is a diagram illustrating an example application using a sample buffer to extend the Farrow filter in accordance with one embodiment of the technology described herein. Like the example illustrated in FIG. 7, the system includes a Farrow Interpolation filter 642, a timing control unit 644, a timing offset estimator, 646 and an ADC 632. The output from timing control unit 644 is fed into the sample buffer 652.

In various embodiments, sample buffer 652 may be implemented, for example, using a first-in, first-out (FIFO) buffer structure to continuously store (write) the incoming data x(m) so that it can be read at the appropriate time and provided to the interpolation or Farrow filter 642. Accordingly, sample buffer 652 can be configured as a FIFO-like sample buffer that contains samples within integer delay range. Samples may be read by the integer delay basepoint index $m_k$ provided by timing control unit 644. As shown in the example of FIG. 10, timing control unit 644 also supplies a fractional delay value $\mu_k$ to the Farrow filter 642.

Accordingly, in this example, timing control unit 644 converts information from the timing offset estimator 646 into $m_k$ and $\mu_k$ signals, the first of which controls sample buffer and the second of which is provided to the Farrow filter. In an ideal case, assuming a continuously variable delay $d_k$ between TX and RX oscillators, this process can be expressed as $$d_k = d_{k-1} + \epsilon$$

where $$\epsilon = \frac{T_i}{T_s}$$

is the sampling period ratio between the transmit and receive oscillators. At some initial time it can be assumed that $d_0 = \tau_{init}$, where $\tau_{init}$ is an initial timing offset. A continuously variable delay $d_k$ may be updated every receive clock, which can be achieved by an accumulator structure. Then, $m_k$ and $\mu_k$ are given by $$m_k = \lfloor d_k \rfloor, \text{ and}$$

$$\mu_k = d_k - m_k.$$

Due to mismatch between the expectation $E\{\epsilon_k\}$ and actual estimate $\tilde{\epsilon}_n$ produced by timing offset estimator 446 during, e.g., the n-th iteration, a residual sampling period ratio of $\Delta\epsilon_n = E\{\epsilon_k\} - \tilde{\epsilon}_n$ exists. That residual $\Delta\epsilon_n$ produces a linearly growing timing error $\tau_{err,k}$ as shown above in FIG. 6. This error is given by $$\tau_{err,k} = \tau_{init} - \tilde{\tau}_{init} + k(T_i - \tilde{\epsilon}_n T_s) = \Delta\tilde{\tau}_{init} + k \times \Delta\epsilon_n T_s.$$

In various embodiments, systems and methods can be implemented to extend the update of variable delay $d_k$ by adding a directly estimated timing offset value $\tilde{\tau}_n$ produced by the timing offset estimator 646 during the n-th iteration. Hence, any residual $\Delta\tau_{init}$ and $\Delta\epsilon_n$ can be compensated during the time when packet is being acquired by receiver. Then, formulas above can be expressed as $$d_k = d_{k-1} + \tilde{\epsilon}_n, \text{ and}$$

$$m_k = \lfloor d_k + \tilde{\tau}_n \rfloor, \text{ and}$$

$$\mu_k = d_k + \tilde{\tau}_n - m_k.$$

Figure 11:
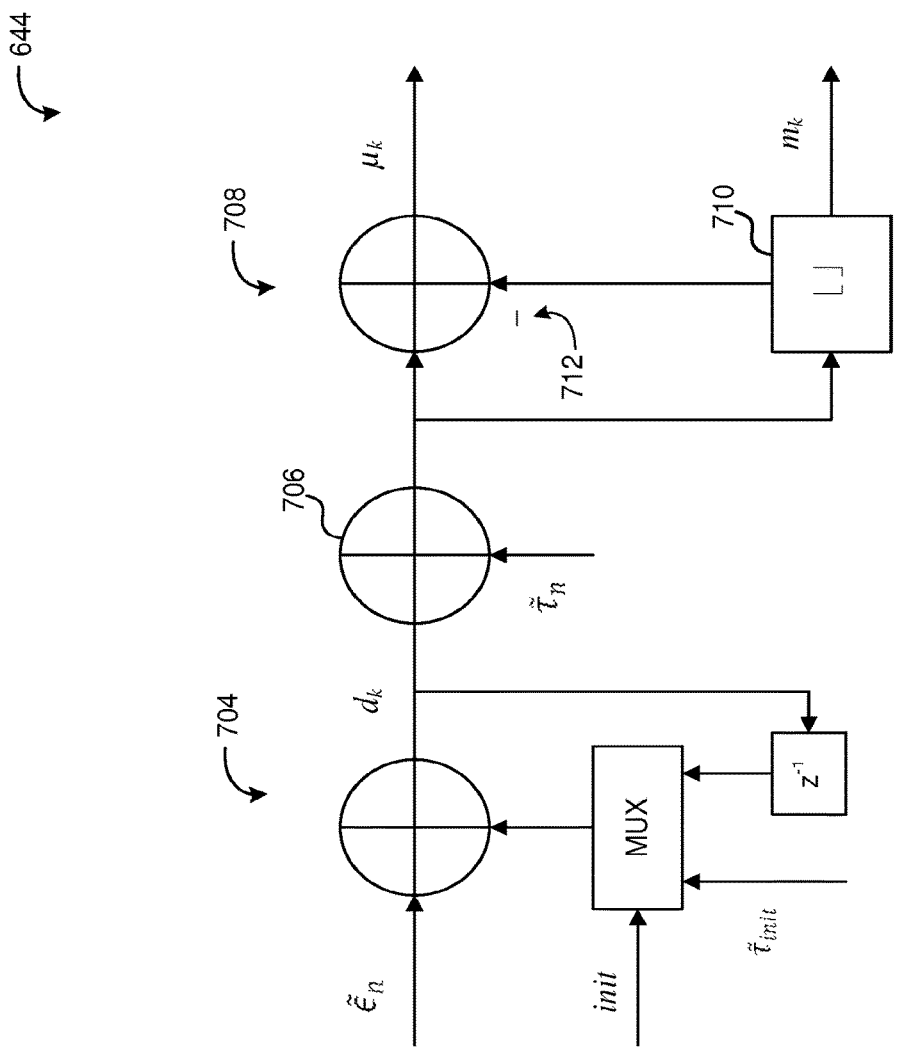
FIG. 11 is a diagram illustrating an example implementation of a timing control unit in accordance with one embodiment of the technology described herein.

FIG. 11 is a diagram illustrating an example implementation of a timing control unit in accordance with one embodiment of the technology described herein. In the example of FIG. 11, an accumulator 704 is included with the timing control unit 644 to accumulate the timing offset as data is received. The timing control unit can be configured such that at the beginning of a packet, a buffer read pointer is set to the middle of the buffer relative to write pointer.

As noted, at the beginning of the packet, the read pointer is set to the middle of the buffer. At every sample, accumulator 704 accumulates data to interpolate the timing offset based on the estimated sampling period ratio $\tilde{\epsilon}_n$. The read pointer will then move left or right (or up or down), or earlier or later in the buffer, relative to write pointer depending on the $\tilde{\epsilon}_n$ value. Consequently, the pointer value will grow positive or negative as the timing offset is accumulated. In other words, as the receive periods may become shorter or longer, the pointer is adjusted to accommodate this change in reading data from the buffer. This can be configured to adjust the read pointer according to the sampling rate mismatch, effectively reading the data more quickly or more slowly to account for this mismatch.

The output of the accumulator is the variable delay $d_k$, Which is combined at adder 706 with the directly estimated timing offset value $\tilde{\tau}_n$ produced by the timing offset estimator 646 during the n-th iteration.

The final stage 708 of timing control unit 604 calculates the integer part $m_k$ and the fractional part $\mu_k$ of the combined output from combiner 706 ($d_k + \tilde{\tau}_n$), and outputs $m_k$ and $\mu_k$ to the interpolator. Particularly a read pointer control signal, $m_k$ is computed as a floor operation 710 of the output of combiner 706, and it is then output to sample buffer 652 to adjust the read pointer as shown in FIG. 10. A filter control signal, $\mu_k$ is computed as the difference 712, $d_k + \tilde{\tau}_n - m_k$, and is output to the Farrow filter 642 is also shown in FIG. 10.

Figure 12:
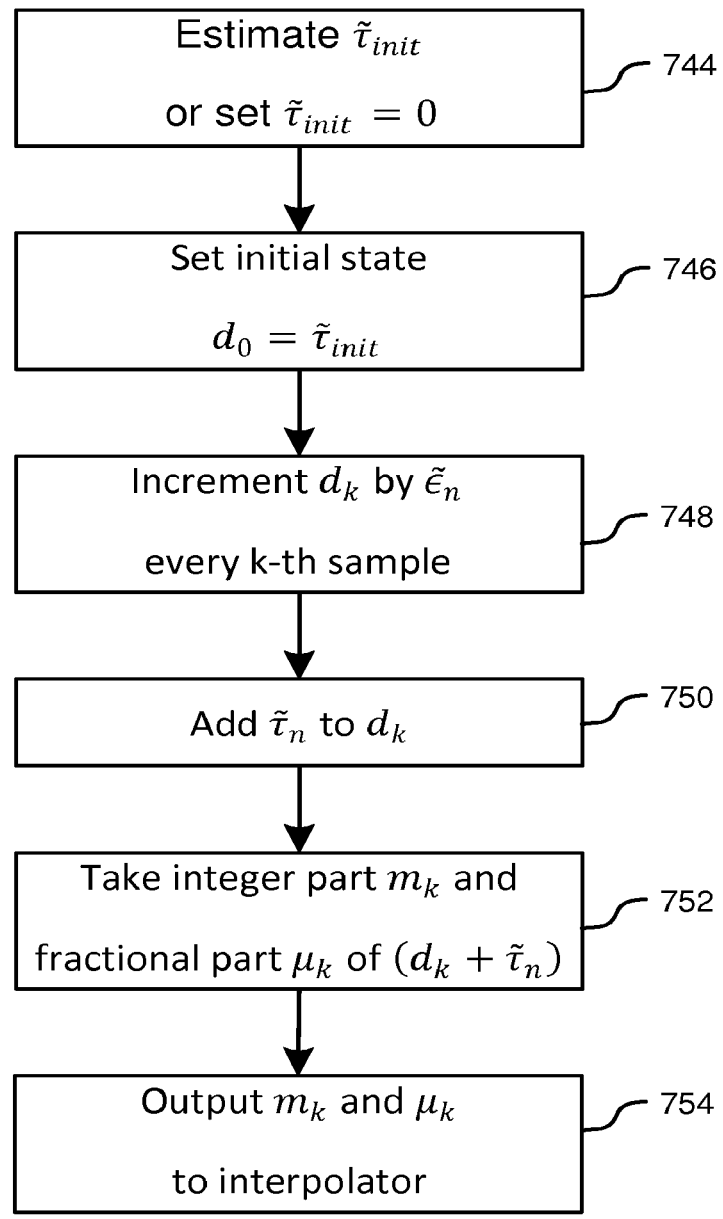
FIG. 12 is an operational flow diagram illustrating an example process for operating the timing control unit in accordance with one embodiment of the technology described herein.

FIG. 12 is an operational flow diagram illustrating an example process for operating the timing control unit in accordance with one embodiment of the technology described herein. At operation 744, the "init" signal resets $d_k$ value to the initial "zero" state. This can be done at the initial packet sample, which can be acquired for example by a received signal strength indication (RSSI) method. This can be implemented in some applications for bursty transmissions with packets of a given length. During the initial "zero" state, at operation 746, timing offset estimator 646 may assign $d_0 = \tilde{\tau}_{init}$. In the case of continuous transmissions, the "init" signal can be periodically triggered and the sample buffer can be reused again. This can be done, for example, in situations where continuous transmissions have designated data sections to do sampling rate resynchronization. In other words, continuous transmissions can be modified to have a form of bursty transmissions.

At operation 748, the system can be configured to increment $d_k$ by $\tilde{\epsilon}_n$ for every k-th sample, and at operation 750, and add $\tilde{\tau}_n$ to $d_k$. The system can then take the integer part $m_k$ and the fractional part $\mu_k$ of $(d_k + \tilde{\tau}_n)$, and output $m_k$ and $\mu_k$ to the interpolator. This is illustrated at operations 752, and 754.

Accordingly, in various embodiments, the timing control unit can be configured to continuously generate $m_k$ and $\mu_k$ by using estimates $\tilde{\epsilon}_n$, $\tilde{\tau}_n$ produced by the timing offset estimator. In some embodiments, the floor operation 710 and the subtraction operation 712 can be replaced by bit-select operations.

Having thus described an example embodiment of a timing control unit 644, an example of a timing offset estimator 646 is now described. In various embodiments, timing offset estimator 646 can be implemented as a non-data-aided real-time subsample timing offset estimator. In various embodiments, the timing offset estimator includes two parts. The first part may be configured to calculate (e.g., indirectly) the sampling period ratio $\tilde{\epsilon}_n$ between the transmitter and a receiver using frequency offset information. The second part may be configured to estimate (e.g., directly) the subsample timing offset $\tau_n$ between a received noisy signal and a local reference signal. This estimation may be configured to support any type of CPM schemes including MSK modulation. The proposed two-parameter scheme accomplishes precise timing offset information tracking.

In various embodiments, sampling period ratio estimation can be implemented as a process for calculating a relationship $\epsilon$ between the transmitter and receiver sampling periods. Such a process can be implemented as an indirect process and may further be implemented in a manner that does not require the sampling period to be synchronized with the symbol rate. Assuming the transmitter and receiver architectures shown in FIG. 3, with only one reference VCO on each side, it can be seen that the transmit and receive sampling periods and the transmit and receive carrier frequencies are directly related because of the common reference VCO for the transmitter and for the receiver. Therefore, using this property, embodiments can be implemented to estimate ∈ as a function of a frequency offset $\Delta f_c$ from the carrier frequency $f_{c_{TX}}$.

More particularly, in various embodiments, the system can be implemented to estimate ∈ as $$\epsilon = 1 - \frac{\Delta f_c}{R_{MIX} f_{TX}} = 1 - \frac{\Delta f_c}{f_{c_{TX}}}.$$

Thus, it is clear that transmit/receive sampling period ratio ∈ can be determined from the frequency offset by knowing the carrier frequency $f_c$ ($f_c \cong f_{c_{TX}}$) and assuming that the sampling clocks and mixer waveforms have the same reference source on transmit and receive sides of the modem structure. One advantage that can be obtained by some embodiments is that this technique can be suited for any modulation type.

In some embodiments, the frequency offset estimator is configured to operate continuously by producing frequency offset estimate $\Delta f_c(n)$ every n-th iteration. Hence, the timing offset estimator may be configured to calculate and supply the timing control unit with estimate $\tilde{\epsilon}_n$ every corresponding iteration. The Doppler effects may decrease precision of such a method, which is the case for the systems where the transmitter and receiver are moving relative to each other.

Various embodiments can be implemented utilizing only sampling period ratio estimation, and omitting direct timing offset estimation. However, other embodiments can be implemented to use both sampling period ratio estimation and direct subsample timing offset estimation. Particularly, various applications may need to estimate instantaneous subsample timing offset $\tilde{\tau}_n$ including the initial timing offset $\tilde{\tau}_{init}$. For example, in some cases frequency offset estimation may not be sufficiently precise where Doppler effects are significant, or in some applications precise subsample timing offset information may be needed for other purposes. Embodiments of the systems and methods described herein can be implemented using a nondata-aided timing offset estimator for CPM signals.

A CPM signal, and, in particular, a MSK baseband signal $y_{k,i}$ on the receiver side can be written as $$y_{k,i} = (-1)^{\phi_k} e^{j\{(-1)^{b_k} \omega T[k + \frac{i}{M} + \tau] + \Delta \omega T[k + \frac{i}{M}] + \theta_0\}} \quad (1)$$

where:

$$\phi_k = a_{2\lfloor \frac{k}{2} \rfloor} = a_{even}$$

is an even data bit of modulating data sequence $a_k \in (0, 1)$;

$$b_k = xnor(a_{2\lfloor \frac{k}{2} \rfloor}, a_{2\lceil \frac{k}{2} \rceil - 1}) = xnor(a_{even}, a_{odd})$$

is the result of an operation that depends on both even and odd bits;

T=1/R is the symbol period;
R is the symbol rate;

$$\omega = \frac{\pi}{2T}$$

is the modulating frequency;
i and M, respectively are the fraction of symbol time 0≤i<M and the symbol oversampling rate M;
τ is the timing offset relative to T; and
$\Delta \omega$ and $\theta_0$, are the frequency offset and initial phase offset, respectively.

After applying frequency and phase offset correctors (FOC and POC), $y_{k,i}$ can be expressed as $$s_{k,i} = (-1)^{\phi_k} e^{j\{(-1)^{b_k} \omega T[k + \frac{i}{M} + \tau]\}}. \quad (2)$$

Next, proposed timing offset estimator algorithm calculates $$s_{k,i}^2 = e^{2j\{(-1)^{b_k} \omega T[k + \frac{i}{M} + \tau]\}}. \quad (3)$$

Assuming that there is an integer relationship between $f_s$ and R, equation (3) can be rewritten in a modified form as $$\tilde{s}_{k,i}^2 = \text{Re}\{s_{k,i}^2\} + j\text{Re}\{s_{k,i-\frac{M}{2}}^2\} = e^{2j\{\omega T[k + \frac{i}{M} + \tau]\}}. \quad (4)$$

Lastly, local reference complex exponential signal $$r_{k,i}^2 = e^{-2j\{\omega T[k + \frac{i}{M}]\}}$$

is generated and multiplied by equation (4) in order to extract error signal $e_{k,i}$ obtained by $$e_{k,i} = \tilde{s}_{k,i}^2 r_{k,i}^2 = e^{2j\{\omega T \tau\}}. \quad (5)$$

By extracting argument of complex signal $e_{k,i}$, timing offset z can be found. For example, argument can be extracted by CORDIC algorithm. Assuming the real-time task is to recursively estimate and minimize timing err $\tau_{err}$ between receive signal $y_{k,i}$ and local reference $r_{k,i}$ in a noisy environment, a simple update algorithm can be used $$\tilde{\tau}_{n+1} = \tilde{\tau}_n - \mu \arg(e_{k,i})$$

where μ is update step size. In practice, multiplication by μ is replaced by right shift with power-of-two step size.

Figure 13:
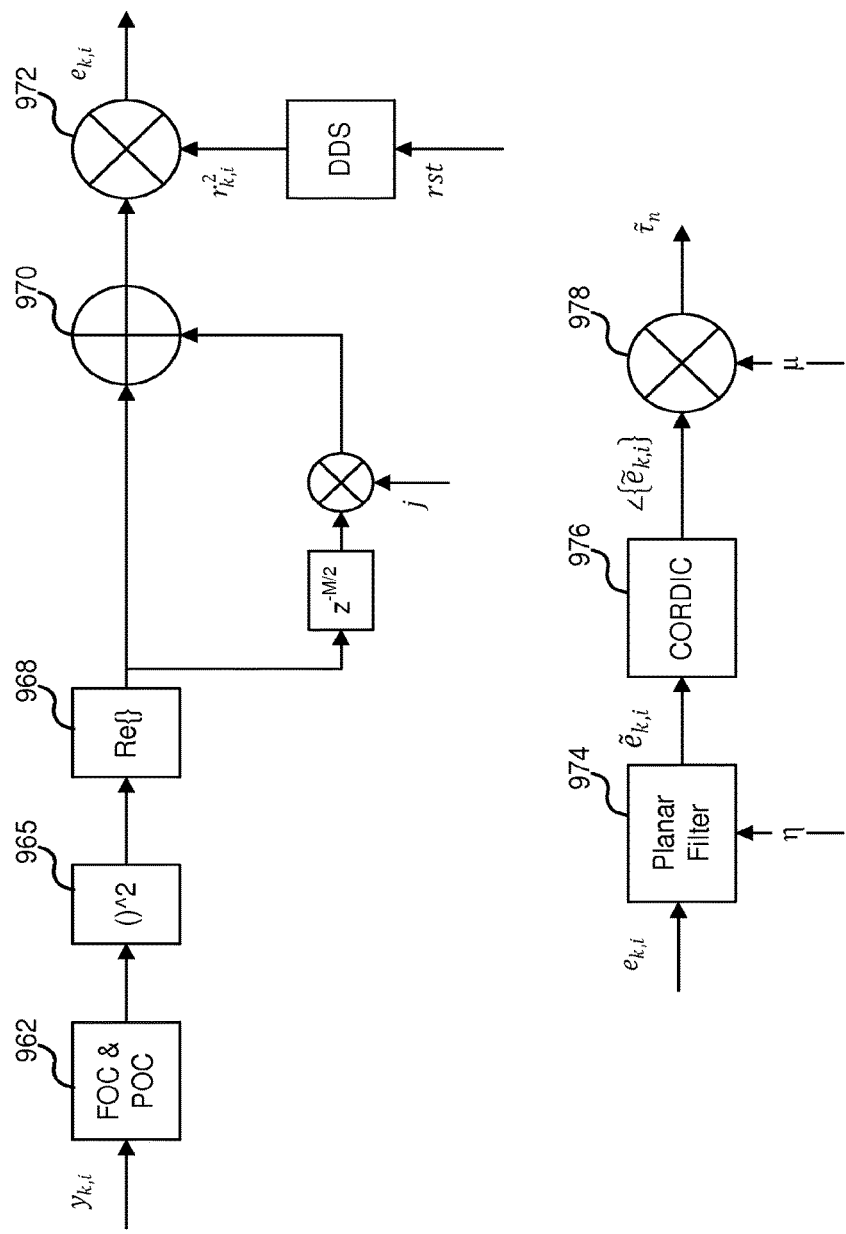
FIG. 13 is a diagram illustrating an example architecture for a direct subsample timing offset estimator in accordance with one embodiment of the technology described herein.
Figure 14:
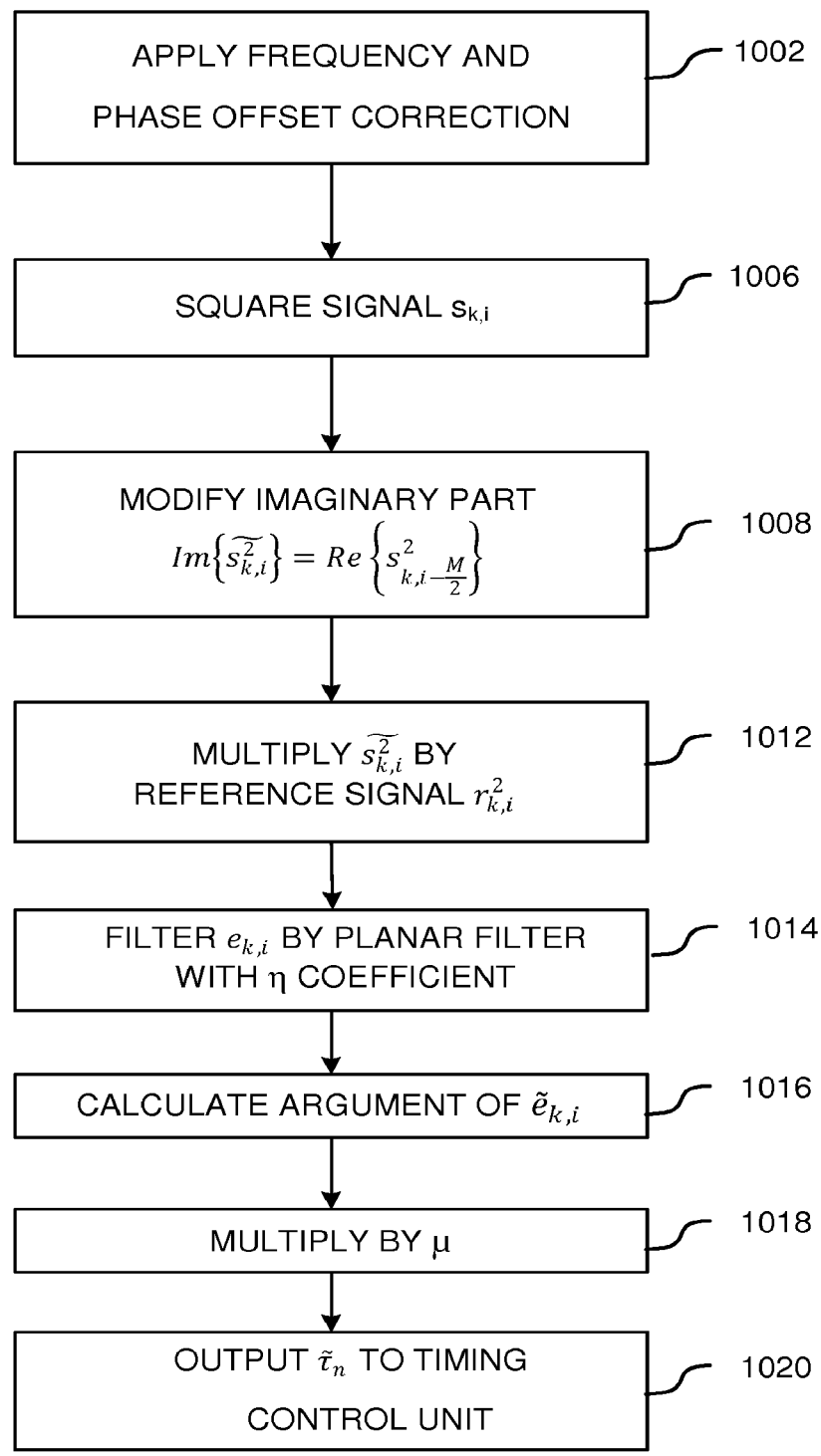
FIG. 14 is an operational flow diagram illustrating an example process for timing offset estimation in accordance with one embodiment of the technology described herein.

FIG. 13 is a diagram illustrating an example architecture for a direct subsample timing offset estimator in accordance with one embodiment of the technology described herein. FIG. 14 is an operational flow diagram illustrating an example process for timing offset estimation in accordance with one embodiment of the technology described herein. Referring now to FIGS. 13 and 14, the example timing offset estimator includes a module 962 to perform frequency and phase offset correction generating signal $s_{k,i}$. This is illustrated at operation 1002. At operation 1006, the corrected signal $S_{k,i}$ is squared by squaring module 965, resulting in squared signal, $s_{k,i}^2$. Module 968 computes the real portion of the squared signal, represented by the notation, $\text{Re}\{s_{k,i}^2\}$. This signal is delayed by M/2, and used as the imaginary part, $$jRe\{s_{k,i-\frac{M}{2}}^2\}$$

of a modified signal. This is illustrated at operation 1008. The real and imaginary signals are combined by combiner 970 to generate a modified complex-valued square signal. This is represented by the notation $\tilde{s}_{k,i}^2$.

At operation 1012, this signal is multiplied by the reference $r_{k,i}^2$, at multiplier 972 to yield a complex signal $e_{k,i}$, whose argument is proportional to τ. A planar filter 974 with coefficient η can be used to smooth argument of signal $e_{k,i}$ at operation 1014 resulting in a signal $\tilde{e}_{k,i}$. At operation 1016, a CORDIC operation performed by CORDIC module 976 extracts the argument of the complex number. This is multiplied by step size μ at multiplier 978, at operation 1018 to arrive at $\tau_n$. At operation 1020, $\tilde{\tau}_n$ is output to the timing control unit. Accordingly, this scheme generates an error signal $e_{k,i}$, and an estimate of the time offset, $\tilde{\tau}_n$.

Figure 15:
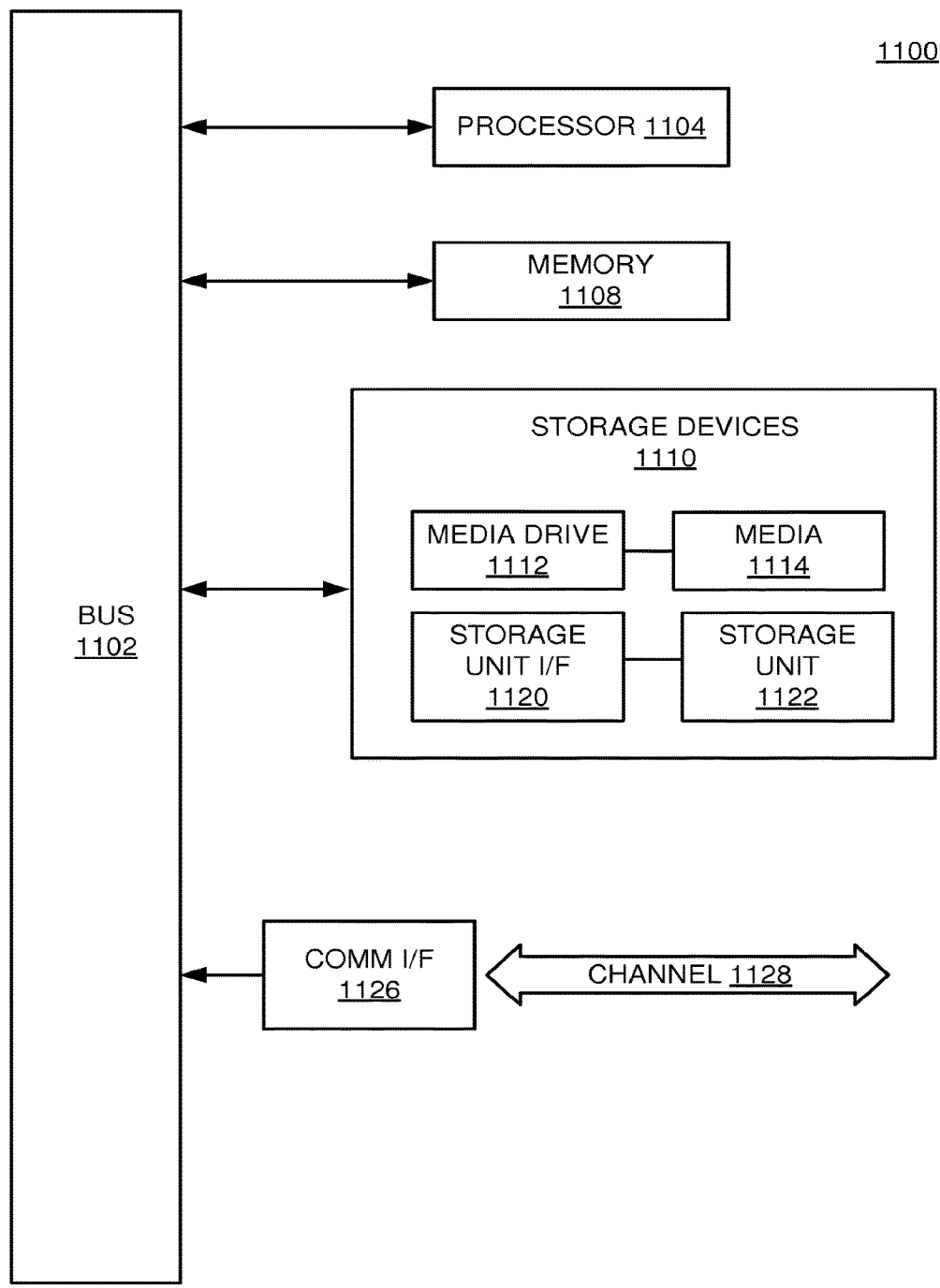
FIG. 15 illustrates an example computing module that may be used in implementing various features of embodiments of the disclosed technology.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 15. Various embodiments are described in terms of this example-computing module 1100. After reading this description, it will become apparent to a person skilled in the relevant art how to implement the technology using other computing modules or architectures.

Referring now to FIG. 15, computing module 1100 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1100 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1100 might include, for example, one or more processors, controllers, control modules, or other processing devices, such as a processor 1104. Processor 1104 might be implemented using a general-purpose or special-purpose processing engine such as, for example, a microprocessor, controller, or other control logic. In the illustrated example, processor 1104 is connected to a bus 1102, although any communication medium can be used to facilitate interaction with other components of computing module 1100 or to communicate externally.

Computing module 1100 might also include one or more memory modules, simply referred to herein as main memory 1108. For example, preferably random access memory (RAM) or other dynamic memory, might be used for storing information and instructions to be executed by processor 1104. Main memory 1108 might also be used for storing temporary variables or other intermediate information during execution of instructions to be executed by processor 1104. Computing module 1100 might likewise include a read only memory ("ROM") or other static storage device coupled to bus 1102 for storing static information and instructions for processor 1104.

The computing module 1100 might also include one or more various forms of information storage mechanism 1110, which might include, for example, a media drive 1112 and a storage unit interface 1120. The media drive 1112 might include a drive or other mechanism to support fixed or removable storage media 1114. For example, a hard disk drive, a floppy disk drive, a magnetic tape drive, an optical disk drive, a CD or DVD drive (R or RW), or other removable or fixed media drive might be provided. Accordingly, storage media 1114 might include, for example, a hard disk, a floppy disk, magnetic tape, cartridge, optical disk, a CD or DVD, or other fixed or removable medium that is read by, written to or accessed by media drive 1112. As these examples illustrate, the storage media 1114 can include a computer usable storage medium having stored therein computer software or data.

In alternative embodiments, information storage mechanism 1110 might include other similar instrumentalities for allowing computer programs or other instructions or data to be loaded into computing module 1100. Such instrumentalities might include, for example, a fixed or removable storage unit 1122 and an interface 1120. Examples of such storage units 1122 and interfaces 1120 can include a program cartridge and cartridge interface, a removable memory (for example, a flash memory or other removable memory module) and memory slot, a PCMCIA slot and card, and other fixed or removable storage units 1122 and interfaces 1120 that allow software and data to be transferred from the storage unit 1122 to computing module 1100.

Computing module 1100 might also include a communications interface 1124. Communications interface 1124 might be used to allow software and data to be transferred between computing module 1100 and external devices. Examples of communications interface 1124 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1124 might typically be carried on signals, which can be electronic, electromagnetic (which includes optical) or other signals capable of being exchanged by a given communications interface 1124. These signals might be provided to communications interface 1124 via a channel 1128. This channel 1128 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1108, storage unit 1120, media 1114, and channel 1128. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1100 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A radio frequency receiver configured to receive a modulated signal transmitted across a channel, the radio frequency receiver comprising:
 a timing offset estimator configured to estimate a timing offset in a timing signal of the receiver relative to a transmitter timing signal and to generate a timing offset signal representing this timing offset; and
 a timing control unit configured to receive the timing offset signal from the timing offset estimator and to convert this timing offset signal into a filter control signal and a buffer pointer control signal,
 wherein the buffer pointer control signal comprises an integer delay basepoint index, and the filter control signal comprises a fractional delay value,
 wherein the integer delay basepoint index comprises $$m_k = \left\lfloor \frac{kT_i}{T_s} \right\rfloor$$

wherein $m_k$ is the delay basepoint index, $T_s$ is a receive sampling period, and $T_i$ is a transmit sampling period.

2. The radio frequency receiver of receiver of claim 1, further comprising a sample buffer configured to store the incoming data so that it can be read at a time based on the integer delay basepoint index, and an interpolation filter coupled to the timing control unit and to the sample buffer, the interpolation filter configured to receive the fractional delay value and data read from the sample buffer at the time based on the integer delay basepoint index, and to perform sample rate synchronization based on the fractional delay value.

3. The radio frequency receiver of claim 1, wherein the fractional delay value comprises $$\mu_k = \frac{kT_i}{T_s} - m_k.$$

4. The radio frequency receiver of claim 1, further comprising a Farrow filter coupled to the timing control unit and configured to receive the fractional delay value and the delay basepoint index, and to perform sample rate synchronization based on the fractional delay value and the delay basepoint index.

5. The radio frequency receiver of claim 1, wherein the timing control unit comprises an accumulator configured to accumulate timing offset as incoming data is received.

6. A radio frequency receiver configured to receive a modulated signal transmitted across a channel, the radio frequency receiver comprising:
a timing offset estimator configured to estimate a timing offset in a timing signal of the receiver relative to a transmitter timing signal and to generate a timing offset signal representing this timing offset; and
a timing control unit configured to receive the timing offset signal from the timing offset estimator and to convert this timing offset signal into a filter control signal and a buffer pointer control signal,
wherein the buffer pointer control signal comprises an integer delay basepoint index, and the filter control signal comprises a fractional delay value,
wherein a delay $d_k$ between the timing signal of the receiver generated by a receive oscillator and the transmitter timing signal of the transmitter generated by a transmit oscillator comprises $$d_k = d_{k-1} + \in$$

where $\in$ is a sampling period ratio between the transmit and receive oscillators.

7. The radio frequency receiver of claim 6, wherein $d_k$ comprises a continuously variable delay, and wherein the integer delay basepoint index comprises $$m_k = \lfloor d_k \rfloor.$$

8. The radio frequency receiver of claim 7, wherein the fractional delay value comprises $$\mu_k = d_k - m_k.$$

9. A radio frequency receiver configured to receive a modulated signal transmitted across a channel, the radio frequency receiver comprising:
a timing offset estimator configured to estimate a timing offset in a timing signal of the receiver relative to a transmitter timing signal and to generate a timing offset signal representing this timing offset; and
a timing control unit configured to receive the timing offset signal from the timing offset estimator and to convert this timing offset signal into a filter control signal and a buffer pointer control signal,
wherein the buffer pointer control signal comprises an integer delay basepoint index, and the filter control signal comprises a fractional delay value,
wherein the timing offset generated by the timing offset estimator comprises an estimated timing offset value $\tilde{\tau}_n$ and an actual estimate $\tilde{\in}_n$, and wherein a delay $d_k$ between the timing signal of the receiver generated by a receive oscillator and the transmitter timing signal of the transmitter generated by a transmit oscillator comprises $$d_k = d_{k-1} + \tilde{\in}_n.$$

10. The radio frequency receiver of claim 9, wherein the integer delay basepoint index comprises $$m_k = \lfloor d_k + \tilde{\tau}_n \rfloor.$$

11. The radio frequency receiver of claim 10, wherein the fractional delay value comprises $$\mu_k = d_k + \tilde{\tau}_n + m_k.$$

12. The radio frequency receiver of claim 11, further comprising a sample buffer configured to store the incoming data x(m) so that it can be read at a time based on the integer delay basepoint index $m_k$.

13. The radio frequency receiver of claim 12, further comprising an interpolation filter coupled to the timing control unit and to the sample buffer, the interpolation filter configured to receive the fractional delay value and the data read from the sample buffer at the time based on the integer delay basepoint index $m_k$, and to perform sample rate synchronization based on the fractional delay value.

14. The radio frequency receiver of claim 13, wherein the interpolation filter comprises a Farrow filter.

15. In a radio frequency receiver, a method for at least partially correcting for a timing offset in a timing signal of the receiver relative to a transmitter timing signal, the method comprising:
receiving packet data into a buffer;
at the beginning of the packet, setting a buffer read pointer to the middle of the buffer;
for each sample, accumulating data to interpolate the timing offset based on an estimated sampling period ratio between the timing signal of the receiver and the transmitter timing signal; and
adjusting the read pointer earlier or later in the buffer, relative to a write pointer based on the accumulated timing offset value.

16. The method of claim 15, wherein adjusting the read pointer earlier or later in the buffer, relative to a write pointer based on the accumulated timing offset value comprises adjusting the read pointer according to a sampling rate mismatch between the transmitter and the receiver to effectively read data from the buffer more quickly or more slowly to account for the mismatch.

17. The method of claim 15, wherein the output of the accumulator is combined in a combiner with a directly estimated timing offset value produced by a timing offset estimator during a given iteration to generate a combined signal.

18. The method of claim 17, further comprising calculating an integer part $m_k$ and a fractional part $\mu_k$ of the combined signal from the combiner.

19. The method of claim 18, further comprising computing a control signal, $m_k$ as a floor operation of the output of the combined signal, and using the control signal to adjust the read pointer.

20. The method of claim 18, wherein a delay $d_k$ between the timing signal of the receiver generated by a receive oscillator and the transmitter timing signal of a transmitter generated by a transmit oscillator comprises $$d_k = d_{k-1} + \tilde{\in}_n;$$

the integer part comprises $$m_k = \lfloor d_k + \tilde{\tau}_n \rfloor;$$

the fractional part comprises $$\mu_k = d_k + \tilde{\tau}_n - m_k;$$

wherein $\tilde{\tau}_n$ represents an estimated timing offset value and $\tilde{\in}_n$ represents an actual estimate provided by a timing offset estimator.

21. In a radio frequency receiver, a method for digitally synchronizing a receive sampling rate to a transmit sampling rate, comprising:
 a timing offset estimator calculating a sampling period ratio of the transmit sampling rate to the receive sampling rate and estimating a subsample timing offset in a timing signal of the receiver relative to a transmitter timing signal; and
 a timing control unit calculating, based on the sampling period ratio and the subsample timing offset, a fractional delay timing offset signal of the receiver relative to a transmitter timing signal and a buffer pointer control signal to control a position of a buffer read pointer relative to a write pointer to compensate for the subsample timing offset.

22. A radio frequency receiver; comprising
 a timing offset estimator module configured to calculate a sampling period ratio of a transmit sampling rate of an oscillator in the transmitter to a sampling rate of an oscillator in the receiver and to estimate a subsample timing offset in a timing signal of the receiver relative to a transmitter timing signal;
 timing control unit module comprising an input to receive the sampling period ratio and the subsample timing offset from the timing offset estimator and configured to calculate based on the sampling period ratio and the subsample timing offset a fractional delay timing offset signal of the receiver relative to a transmitter timing signal and a buffer pointer control signal to control a position of a buffer read pointer relative to a write pointer to compensate for the subsample timing offset.

23. The radio frequency receiver of claim 22, further comprising a digital interpolator comprising a sample buffer and a fractional delay filter coupled to the sample buffer, wherein the sample buffer is configured to receive the buffer read pointer and to output data to the fractional delay filter based on the buffer read pointer to compensate for subsample timing offset between the transmit oscillator and the receive oscillator.

* * * * *